United States Patent [19]

Kanazawa

[11] 3,988,761

[45] Oct. 26, 1976

[54] FIELD-EFFECT TRANSISTOR AND METHOD OF MAKING THE SAME

[75] Inventor: Masayoshi Kanazawa, Atsugi, Japan

[73] Assignee: Sony Corporation, Tokyo, Japan

[22] Filed: Jan. 29, 1973

[21] Appl. No.: 327,513

Related U.S. Application Data

[63] Continuation of Ser. No. 113,447, Feb. 8, 1971, abandoned.

[30] Foreign Application Priority Data

Feb. 6, 1970  Japan............................ 45-11028

[52] U.S. Cl.................................. 357/41; 357/23; 357/46
[51] Int. Cl.².......................................... H01L 27/02
[58] Field of Search.................... 317/235 B, 235 G; 357/23, 41, 46

[56] References Cited

UNITED STATES PATENTS

| | | | |
|---|---|---|---|
| 3,455,020 | 7/1969 | Dawson et al. | 29/571 |
| 3,631,310 | 12/1971 | Das | 317/235 R |
| 3,653,978 | 4/1972 | Robinson et al. | 148/1.5 |
| 3,667,115 | 6/1972 | Barson et al. | 29/571 |
| 3,711,940 | 1/1973 | Allison et al. | 29/571 |

OTHER PUBLICATIONS

Y. Tarui et al., "Diffusion Self–Aligned Most And Lateral Trans.," Vortrag Zum 4, Mikroelektronik–Kongreb in Munich, Nov. 1970, pp. 102–128.

Primary Examiner—Michael J. Lynch
Assistant Examiner—Joseph E. Clawson, Jr.
Attorney, Agent, or Firm—Lewis H. Eslinger; Alvin Sinderbrand

[57] ABSTRACT

A dual gate field-effect transistor with two diffusion regions of the same conductivity type and a semi-conductive layer of the opposite conductivity type. Each of the diffusion regions has a second diffusion region thereon of the opposite conductivity type diffused at least partly through the same mask to create narrow, controlled channels but with one of the upper diffused regions extending over the edge of the diffused regions below it. The other upper diffused region has an ohmic contact and serves as a source. Two other ohmic contacts are placed on the metal deposited on thin insulating layers directly over edge parts of the first diffused regions to serve as first and second gate electrodes. Another semi-conductive portion, which may be a diffused region of the other conductivity, has an ohmic contact and serves as a drain.

7 Claims, 6 Drawing Figures

INVENTOR.
MASAYOSHI KANAZAWA
BY
Lewis H. Eplinger
ATTORNEY

FIELD-EFFECT TRANSISTOR AND METHOD OF MAKING THE SAME

This is a continuation of application Ser. No. 113,447, filed Feb. 8, 1971 now abandoned.

FIELD OF THE INVENTION

This invention relates to metal-oxide-silicon type field-effect transistors and particularly to such transistors having dual gates.

BACKGROUND OF THE INVENTION

In making field-effect transistors (FET's) it is desirable to achieve very small and precise channel lengths to improve the high frequency operation. Furthermore, it is advantageous to minimize the feedback capacitance from the drain to the input gate electrode.

It has been known heretofore to carry out successive diffusion steps through a single mask and to control the diffusion process so that the boundary of the second diffusion will closely approximate the boundary of the first and will leave a thin channel between the second diffusion region and the layer in which the first diffusion takes place. However, the reduction of channel length due to the depletion layers still affects the equivalent channel length.

Accordingly, it is an object of the present invention to provide a metal-oxide-silicon type (MOS type) FET of the tetrode type with precisely controlled channels of very small dimensions.

It is another object of the present invention to provide a tetrode MOS type FET having minimum feedback capacitance between the drain and the input gate.

It is a still further object of the invention to provide an MOS type FET having improved high frequency performance.

BRIEF DESCRIPTION OF THE INVENTION

The semi-conductor device of the present invention includes a semi-conductive substrate of one conductivity type with a layer of semi-conductive material of the opposite conductivity type on the surface of the substrate. First and second spaced diffusion regions of the first conductivity type are formed in the layer and extend therethrough into contact with the substrate. Third and fourth diffusion regions of the opposite conductivity type are formed in the first and second diffusion regions, respectively. The third diffusion region is formed through the same mask as the first diffusion region, while the fourth diffusion region is formed through a mask which has been enlarged along one edge so that that diffusion region overlaps one edge of the second diffusion region immediately under it and extends into contact with the semi-conductive layer. However, a channel of precise dimensions is still formed between the other edge of the second and fourth diffusion regions on the side away from the first and third diffusion regions. A fifth diffusion region of the same conductivity type as the layer is formed entirely in the layer and placed so that the second diffusion region is between the first diffusion region and the fifth diffusion region. The layer and the diffusion regions are covered by an insulating layer except in certain specific locations. One of these is the source electrode, which makes contact only with the third diffusion region, and another is the drain electrode, which makes contact only with the fifth diffusion region on the side facing the second diffusion region is covered by a thin insulating coating over which is placed the first gate electrode. This electrode and the thin insulating layer beneath it not only extend over the channel region but may also extend over adjacent portions of the semi-conductive layer and the third diffusion region. A second gate electrode similarly overlaps the channel of the second diffusion region between the semi-conductive layer and the fourth diffusion region and is separated therefrom by another thin insulating layer.

BRIEF DESCRIPTION OF THE DRAWINGS

The invention will be described in greater detail in connection with the drawings in which.

DETAILED DESCRIPTION OF THE INVENTION

Figure 1:
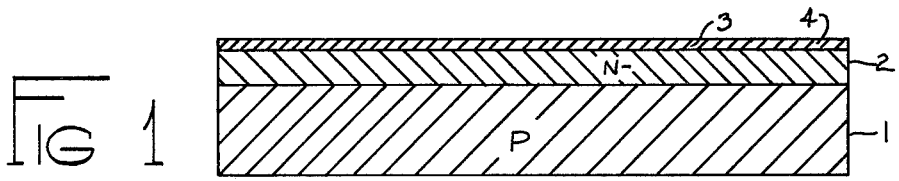
FIGS. 1–6 show successive steps in the formation of a semi-conductor according to the invention.

The first step in the manufacture of a transistor according to this invention is shown in FIG. 1. A semiconductor substrate 1 forms the main supporting element. For the sake of clarity of description, this semiconductor is a P-type semi-conductor, although it could be an N-type instead. On top of the substrate 1 is a vapor deposited layer 2 of N-type semi-conductor material. This layer may be an epitaxial layer and on the upper surface 3 is a thin insulating layer 4 of, for example, SiO or $SiO_2$.

The next step in the manufacture of the transistor is the formation of two windows 4A and 4B in the layer 4. These windows may be formed conventionally by a photographic process. Thereafter, a P-type dopant is diffused through the windows 4A and 4B into the layer 2 to form a pair of diffused regions 5A and 5B. The impurity concentration in the layer 2 is relatively lower, for example about $10^{15}$ to $10^{16}$ atoms per centimeter cube while the impurity concentration in the regions 5A and 5B is about $10^{16}$ to $10^{17}$ atoms per centimeter cube. The diffusion of the dopant to form the regions 5A and 5B is controlled so that these regions extend into contact with the substrate 1. Since the diffused regions 5A and 5B are of the same conductivity type as the substrate, the interfaces between these regions and the substrate are shown in dotted lines.

Figure 2:
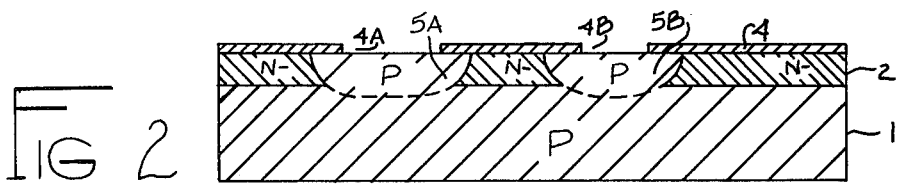
Figure 3:
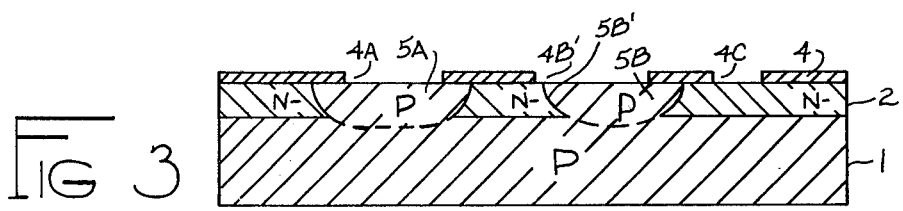
Figure 4:
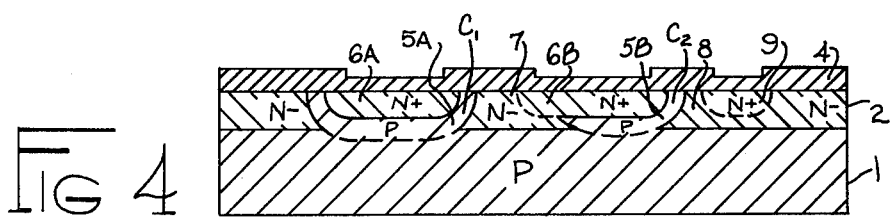
Figure 5:
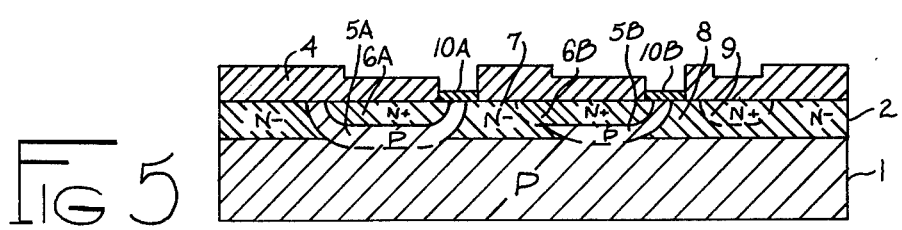
Figure 6:
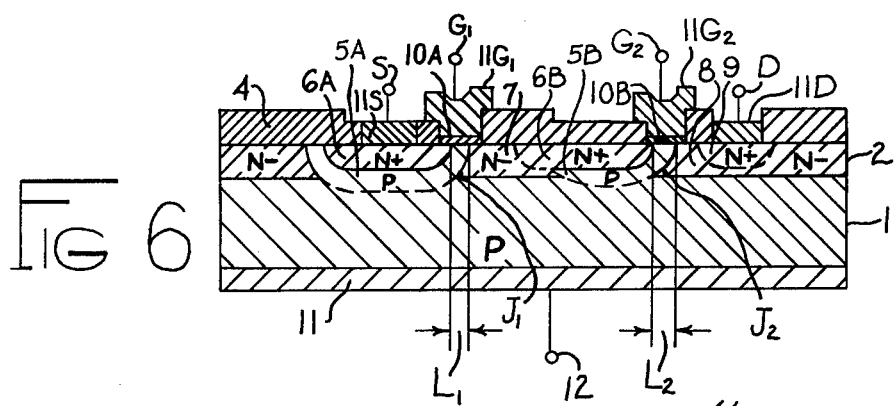

After this diffusion step, the windows are re-formed over the diffusion regions. The configuration of the window 4A is identical in the step exemplified in FIG. 3 to that exemplified in FIG. 2, but the left-hand edge of the window 4B' is located further to the left than in the case of the original window 4B. As a result, an edge 5B' of the diffused region 5B is exposed. A third window 4C is formed at the same time and placed so that the window 4B' is between the window 4A and the window 4C.

After the formation of these windows, a second diffusion process is carried out to diffuse an N-type impurity through the windows. The impurity forms regions 6A, 6B and 9, and because the impurity concentration of these regions is relatively large, about $10^{19}$ to $10^{20}$ atoms per centimeter cube, they are identified by the designation $N^+$. The diffusion of dopant to form the region 6A passes through exactly the same shape opening 4A as the diffusion of the dopant that forms the region 5A. The diffusion conditions are controlled so that the region 6A does not occupy quite as much volume as the region 5A but leaves a small channel between the region 6A and the adjoining portion of the layer 2 and the substrate 1.

Because the window 4B' is enlarged somewhat with respect to the size of the window 4B, the region 6B is not entirely confined within the region 5B but overlaps it on the side facing the region 5A. Since the region 6B contains an N-type impurity which is the same as the layer 2, except for the concentration, the boundary between the diffused region 6B and the central part of the layer, which is identified by reference numeral 7, is shown in dotted lines.

Similarly, the diffused region 9 is separated from the layer 2 only by dotted lines.

The formation of the diffused regions 6A, 6B and 9 is followed by the application of additional insulating material over layer 4 which results in the formation of relatively thin layers of insulating material on top of diffused regions 6A, 6B and 9. The next step in producing a transistor according to the invention is to remove selected portions of this insulating material immediately over a portion of the channel $C_1$ on the side of the diffused region 5A closer to the diffused region 5B. At the same time, a similar portion of the channel of the diffused region 5B remote from the region 5A is also exposed. Both of these exposed channels are coated with thin insulating layers 10A and 10B.

The final step in the formation of a transistor according to the invention is to place ohmic metal electrodes $11G_1$ and $11G_2$ over the thin insulating layers 10A and 10B, respectively. These form the gate electrodes $G_1$ and $G_2$. A source electrode 11S is formed by removing part of the insulating material directly over the diffused region 6A and placing an ohmic material in contact with the exposed diffused region. The terminal connected to this ohmic contact 11S is identified by reference numeral S as the source of the FET.

The drain region 9 is contacted by an ohmic material 11D, such as aluminum or gold, which is connected to a terminal D.

The control of diffusion of the regions 6A and 6B into the regions 5A and 5B can be so exact that the length $L_1$ and $L_2$ of the channels $C_1$ and $C_2$ can be of the order of a micron. Because of the relationship of the conductivity types, the depletion layers in the area identified by the reference designations $J_1$ and $J_2$ does not change the channel lengths, and "punchthrough" is eliminated. Instead, the depletion layers of the junctions $J_1$ and $J_2$ extend, respectively, toward the regions 7 and 8.

What is claimed is:

1. A metal-insulator-semiconductor field-effect transistor comprising:
   A. a semiconductor substrate of one conductivity type;
   B. a semiconductor layer of the opposite conductivity type on one surface of said substrate;
   C. first and second semiconductor regions of said one type diffused through said layer and into contact with said substrate;
   D. a third semiconductor region of said opposite conductivity type diffused into said first region so that said first region forms a first shell-like narrow channel region between said third region and said layer, the edge of said shell-like narrow channel region being between the surface of said third region and the surface of said layer;
   E. a fourth semiconductor region of said opposite conductivity type diffused into said second region and extending beyond the edge thereof and into contact with said layer between said first and second regions, said second region forming a second shell-like narrow channel region between said layer and the side of said fourth region away from said first region;
   F. a drain region of said opposite conductivity type;
   G. a first electrode connected to said drain region;
   H. a second electrode connected to said third diffused region as a source electrode;
   I. a layer of insulating material over said first channel region;
   J. a first gate electrode on said insulating layer;
   K. a second insulating layer over said second channel region; and
   L. a second gate electrode on said second insulating layer.

2. The field-effect transistor of claim 1 in which said drain region comprises a fifth diffused region of the opposite conductivity type in said layer.

3. The field-effect transistor of claim 1 in which said first-mentioned layer of insulating material covers part of the edge portion of said first diffused region closer to said second diffused region.

4. The field-effect transistor of claim 1 in which said second insulating layer covers a part of the edge portion of said second diffused region remote from said first diffused region.

5. The field-effect transistor of claim 1 in which said second diffused region is between said first diffused region and said drain region.

6. The field-effect transistor of claim 1 comprising a further region between said first and fourth regions, said further region and said fourth region being electrically separated from said drain region by said second region.

7. The field-effect transistor of claim 6 in which the impurity concentration of said further region is lower than that of said first region and the impurity concentration of the region between said drain region and said second region is lower than that of said second region.

* * * * *